United States Patent
Reinberg

(10) Patent No.: US 6,844,230 B2
(45) Date of Patent: *Jan. 18, 2005

(54) METHODS OF FORMING CAPACITORS AND RESULTANT CAPACITOR STRUCTURES

(75) Inventor: Alan R. Reinberg, Westport, CT (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/082,594

(22) Filed: Feb. 22, 2002

(65) Prior Publication Data

US 2002/0086479 A1 Jul. 4, 2002

Related U.S. Application Data

(63) Continuation of application No. 09/389,533, filed on Sep. 2, 1999, now Pat. No. 6,403,442.

(51) Int. Cl.[7] .......................................... H01L 21/8242
(52) U.S. Cl. ...................... 438/253; 438/255; 438/396; 438/398; 438/666
(58) Field of Search .................................. 438/253, 255, 438/396, 398, 666; 257/306–309

(56) References Cited

U.S. PATENT DOCUMENTS

| | | | |
|---|---|---|---|
| 5,338,700 A | | 8/1994 | Dennison et al. |
| 5,905,280 A | | 5/1999 | Liu et al. |
| 5,981,333 A | | 11/1999 | Parekh et al. |
| 6,136,646 A | * | 10/2000 | Linliu et al. ................ 438/255 |
| 6,150,211 A | | 11/2000 | Zahurak |
| 6,159,793 A | * | 12/2000 | Lou ........................... 438/255 |
| 6,235,605 B1 | * | 5/2001 | Ping .......................... 438/398 |
| 6,326,277 B1 | * | 12/2001 | DeBoer ...................... 438/398 |
| 6,403,442 B1 | * | 6/2002 | Reinberg .................... 438/396 |

* cited by examiner

*Primary Examiner*—Hsien-Ming Lee
(74) *Attorney, Agent, or Firm*—Wells St. John P.S.

(57) ABSTRACT

Methods of forming capacitors and resultant capacitor structures are described. In one embodiment, a capacitor storage node layer is formed over a substrate and has an uppermost rim defining an opening into an interior volume. At least a portion of the rim is capped by forming a material which is different from the capacitor storage node layer over the rim portion. After the rim is capped, a capacitor dielectric region and a cell electrode layer are formed over the storage node layer.

35 Claims, 11 Drawing Sheets

METHODS OF FORMING CAPACITORS AND RESULTANT CAPACITOR STRUCTURES

CROSS REFERENCE TO RELATED APPLICATION

This patent application is a Continuation Application of U.S. patent application Ser. No. 09/389,533, filed Sep. 2, 1999, now U.S. Pat. No. 6,403,442 B1 which issued Jun. 11, 2002, entitled "Methods of Forming Capacitors and Resultant Capacitor Structures", naming Alan R. Reinberg as inventor, the disclosure of which is incorporated herein by this reference.

TECHNICAL FIELD

The present invention relates to methods of forming capacitors and to resultant capacitor structures.

BACKGROUND OF THE INVENTION

As integrated circuitry dimensions continue to shrink, challenges are posed with respect to the techniques through which integrated circuit structures are formed. For example, with very small device dimensions, unwanted conductive particles present during fabrication can cause undesired shorting should they come into contact with, and not be adequately removed from integrated circuitry being formed. One type of integrated circuit structure is a capacitor. Such capacitors are typically used in dynamic random access memory circuitry. Undesired shorting can take place if such conductive particles are allowed to undesirably contact the capacitor storage nodes of such capacitors.

Accordingly, this invention arose out of concerns associated with providing improved methods of forming integrated circuitry which reduce the risk of undesired particles shorting the resultant integrated circuitry structures. In particular, this invention arose out of concerns associated with providing improved methods of forming capacitors, and resultant capacitor constructions.

SUMMARY OF THE INVENTION

Methods of forming capacitors and resultant capacitor structures are described. In one embodiment, a capacitor storage node layer is formed over a substrate and has an uppermost rim defining an opening into an interior volume. At least a portion of the rim is capped by forming a material which is different from the capacitor storage node layer over the rim portion. After the rim is capped, a capacitor dielectric region and a cell electrode layer are formed over the storage node layer.

In another embodiment, a capacitor storage node layer is formed within a container which is received within an insulative material. A capacitor storage node layer is formed within the container and has an outer surface. A layer of material is formed within less than the entire capacitor container and covers less than the entire capacitor storage node layer outer surface. The layer of material comprises a material which is different from the insulative material within which the capacitor container is formed. After the capacitor storage node layer and the layer of material are formed, a capacitor dielectric functioning region is formed which is discrete from the layer of material and operably proximate at least a portion of the capacitor storage node layer outer surface. A cell electrode layer is formed over the dielectric functioning region and the layer of material.

In another embodiment, a capacitor container is formed within an insulative material over a substrate. A capacitor storage node is formed within the container and has an uppermost surface and a side surface joined therewith. A protective cap is formed over the uppermost surface. A dielectric layer is formed over at least some of the side surface and protective cap. A cell electrode layer is formed over the side surface of the capacitor storage node.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
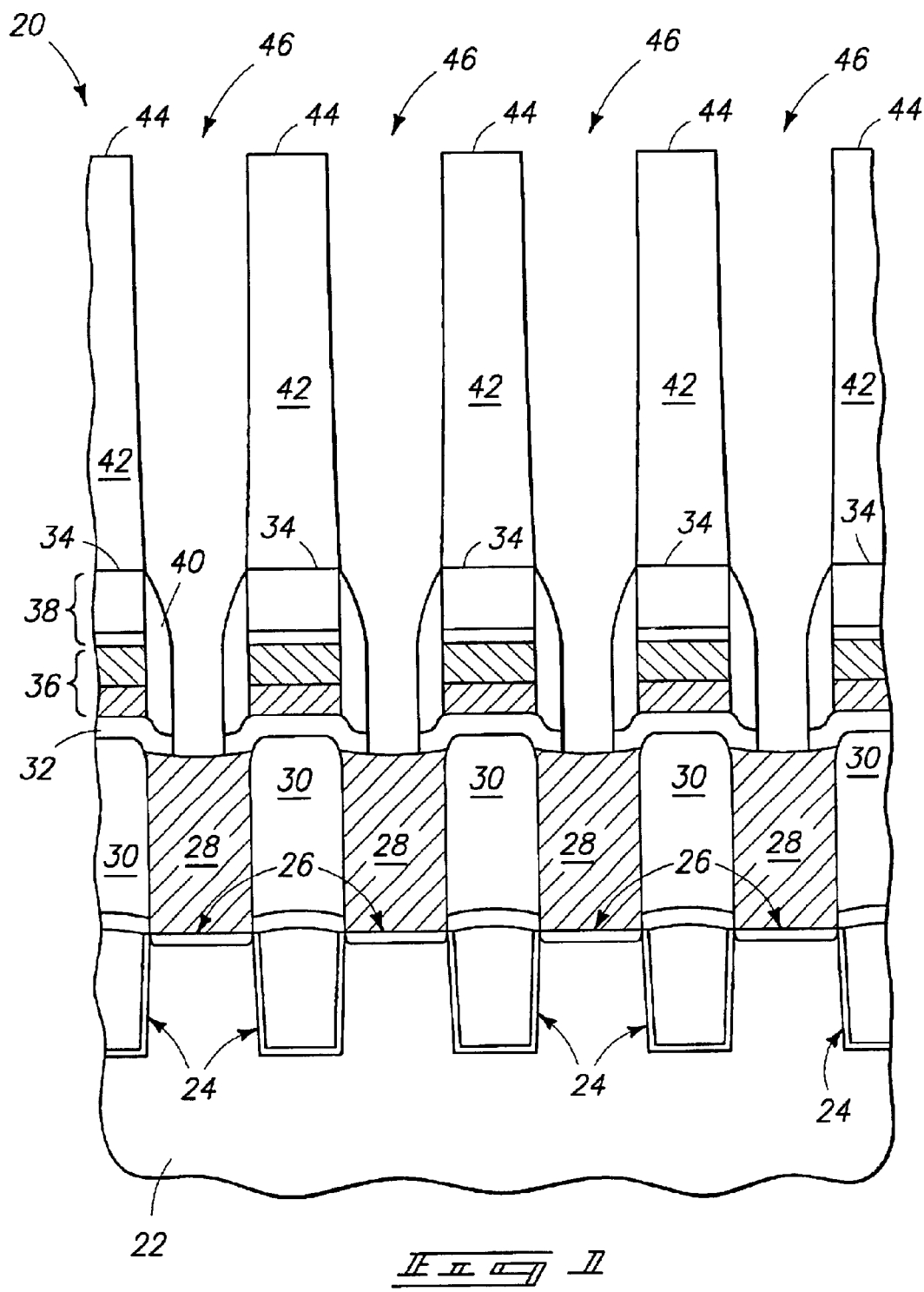
FIG. 1 is a diagrammatic side sectional view of a semiconductor is wafer fragment undergoing processing in accordance with one embodiment of the invention.

Referring to FIG. 1, a semiconductor wafer fragment in process is shown generally at 20 and includes a semiconductive substrate 22. In the context of this document, the term "semiconductive substrate" is defined to mean any construction comprising semiconductive material, including, but not limited to, bulk semiconductive materials such as a semi-conductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 22 includes a plurality of isolation regions 24 which can be formed through known techniques such as trench and refill techniques. Between isolation regions 24 are defined active areas 26 which have diffusion regions (undesignated) received therein and which constitute node locations with which electrical communication is desired. Conductive material plugs or studs 28 can be provided by forming a conductive material, such as polysilicon, over the substrate and suitably recessing it relative to insulative material structures 30. An exemplary insulative material is borophosphosilicate glass (BPSG). An insulative layer 32 can be provided as through decomposition of TEOS. A plurality of conductive lines 34 are provided and include conductive portions 36 and insulative portions 38. Conductive portion 36 can comprise polysilicon or polysilicon and a refractory metal layer, or any other suitable material. Insulative portion 38 can comprise any suitable insulative material. Sidewall spacers 40 are also provided and are anisotropically etched as is known.

An insulative material layer 42 is formed over substrate 22 and preferably has a generally planar outer surface 44. For purposes of the ongoing discussion, layer 42 constitutes a first material or a container-defining material, with an exemplary material comprising BPSG. A plurality of capacitor containers 46 are patterned and etched, or otherwise formed over substrate 22 and received within insulative material layer 42.

Figure 2:
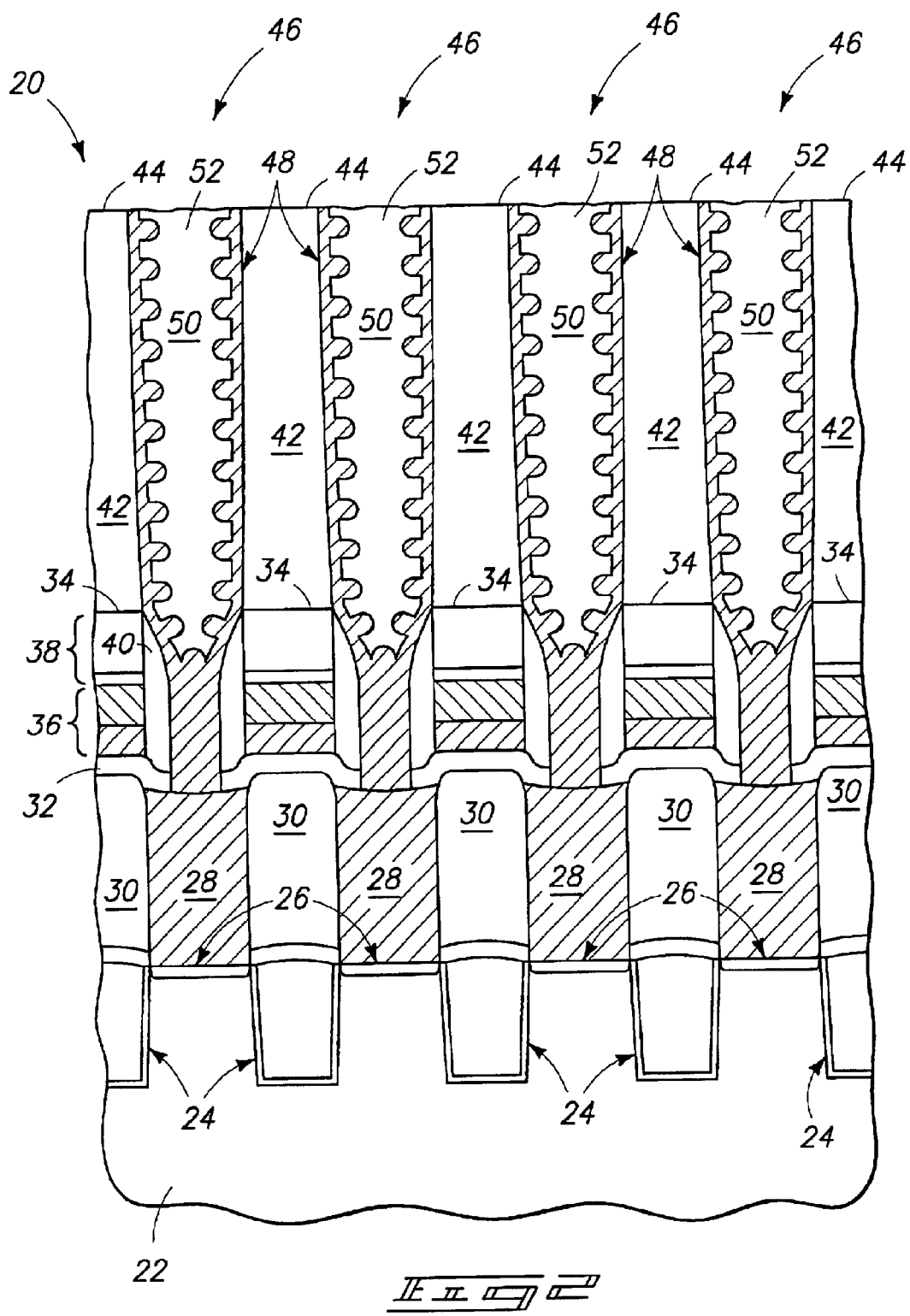
FIG. 2 is a view of the FIG. 1 wafer fragment at a processing step which is different from that which is shown in FIG. 1.

Referring to FIG. 2, a capacitor storage node layer 48 is formed over substrate 22. Typically, such layer is formed by forming a conductive layer over the substrate and within the capacitor opening, and then planarizing the layer relative to outer surface 44 to electrically isolate individual storage nodes within their respective containers. Planarization of the conductive layer can take place through techniques such as chemical mechanical polishing (CMP). Different types of conductive material can be used to form the storage node layers. In the illustrated and preferred embodiment, layer 48 comprises roughened polysilicon with hemispherical grain (HSG) polysilicon being but one example. Each of the storage node layers 48 define an individual interior volume 50. Preferably, prior to planarizing the conductive layer to electrically isolate the individual storage node layers, a filler or filling material 52 is provided into interior volume 50. This material ensures that the isolation techniques which are utilized to isolate the capacitor storage node layers (e.g. chemical mechanical polishing) do not dislodge conductive material into the interior volume within the containers. An exemplary material for material 52 is a polymer material such as photoresist and the like.

Figure 3:
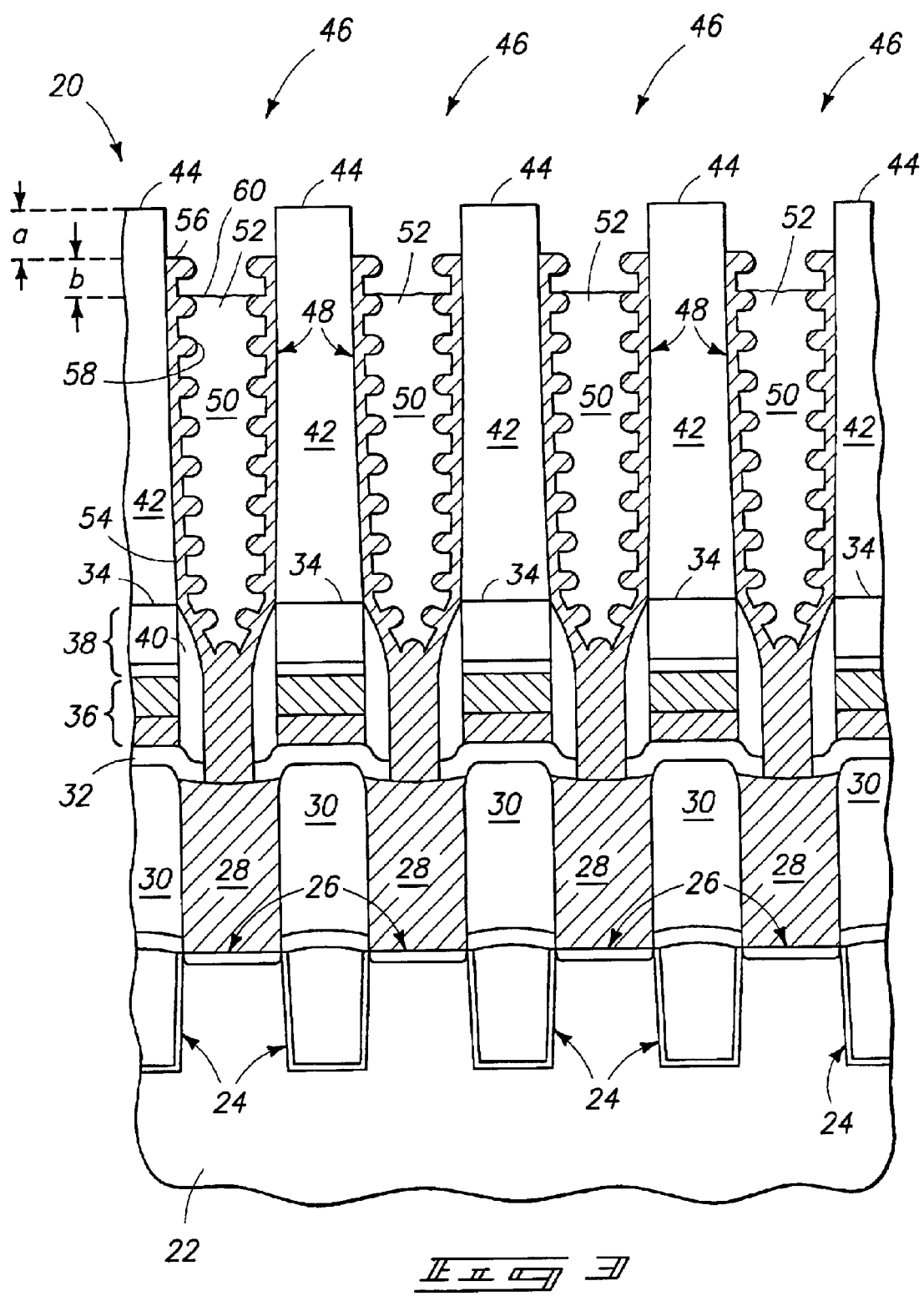
FIG. 3 is a view of the FIG. 1 wafer fragment at a processing step which is different from that which is shown in FIG. 2.

Referring to FIG. 3, amounts of both capacitor storage node layer 48 and filler material 52 are removed. In the illustrated example, an amount of storage node layer material corresponding to distance "a" has been removed, and an amount of filler material 52 corresponding to distance "a"+"b" has been removed. In this example, "a" is equal to about 100 Angstrom, and "b" is equal to from between about 100 to 750 Angstrom, with about 500 Angstrom being preferred. Removal of the amounts of the capacitor storage node layer and the filler material can take place through a single etch. Such etch would preferably be highly selective to the material from which layer 42 is formed, e.g. BPSG, while etching material 52 at a somewhat faster rate than the material from which the storage node layer is formed. Alternately, an etch of one of materials 48 and 52 can be conducted first, followed by an etch of the other of the materials 48 and 52. While both wet and dry etches can be utilized, dry etches are preferred. For example, and where material 48 comprises HSG polysilicon and material 52 comprises a polymer such as photoresist, a first etch of the polysilicon can be conducted using a chemistry including $CF_4$ with from between 2% to 10% $O_2$. This etch can be used to etch the polysilicon principally with a high selectivity to the BPSG, e.g. greater than about 20:1. Subsequently, the polymer can be etched selective to the BPSG and polysilicon by using an oxygen-containing etch such as one with constituents such as $O_2$, $N_2O$, and $CO_2$.

As shown in FIG. 3, capacitor storage node layer 48 includes an outer surface comprising an outside surface 54, an uppermost surface 56 joined with outside surface 54, and an inside surface 58 joined with uppermost surface 56. Uppermost surface 56 provides an uppermost rim which defines an opening into interior volume 50. Inside surface 58 is spaced inwardly from outside surface 54, with both surfaces (both of which constitute side surfaces) extending away from the node location defined by active areas 26. The outside and inside surfaces terminate proximate an opening into an interior region, i.e. interior volume 50. Preferably, portions of capacitor storage node layer 48 are removed which are sufficient to recess the capacitor storage node layer to below generally planar outer surface 44. Accordingly, uppermost surface 56 is disposed elevationally below generally planar outer surface 44. A portion of container 46 is filled so with filling or filler material 52 sufficiently to provide a filling material upper surface 60 disposed elevationally below uppermost surface 56 of capacitor storage node layer 48. Accordingly, such constitutes partially filling the capacitor container with filler material. Accordingly, less than the entire interior volume 50 is filled with filler material.

Figure 4:
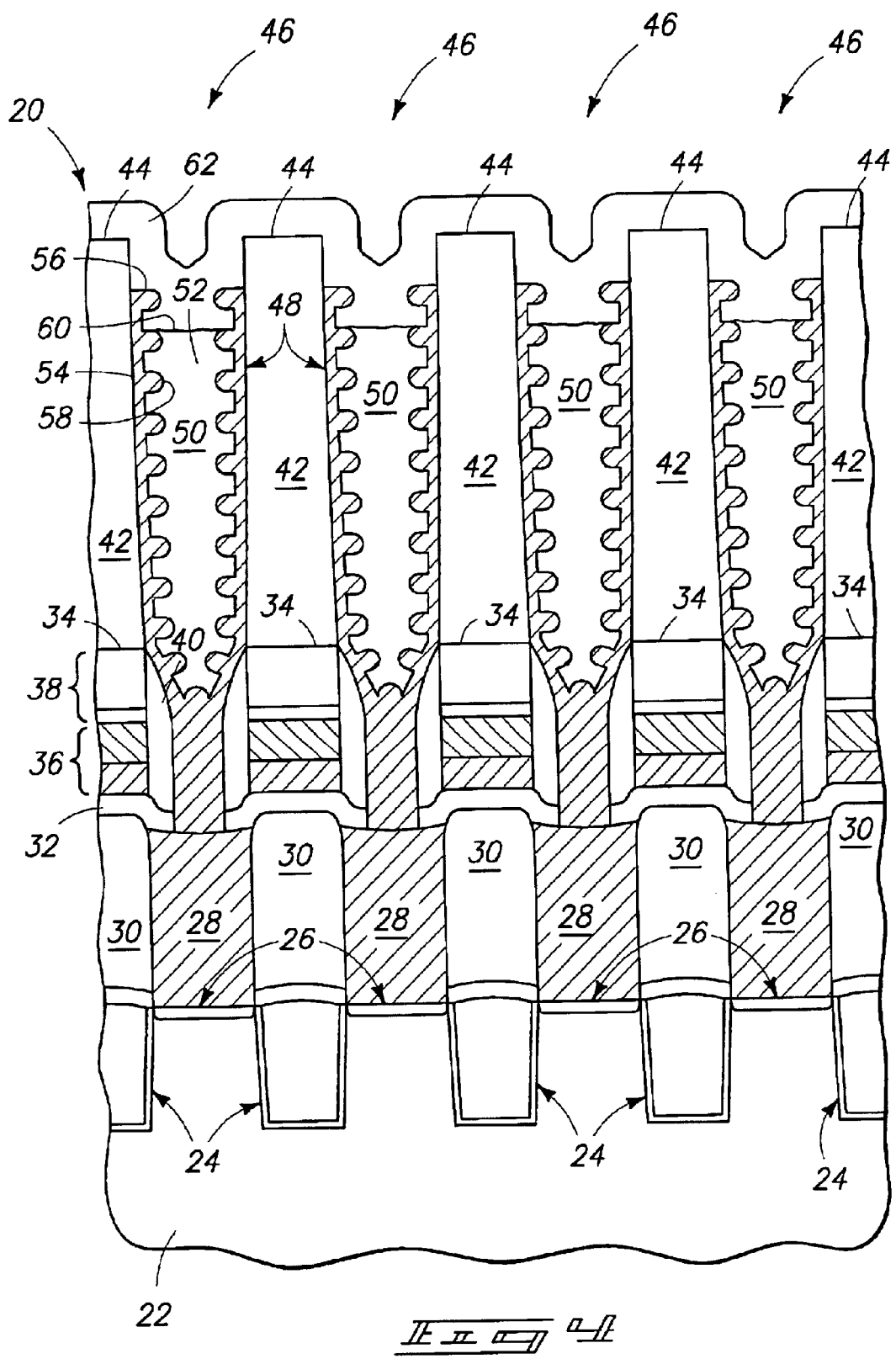
FIG. 4 is a view of the FIG. 1 wafer fragment at a processing step which is different from that which is shown in FIG. 3.

Referring to FIG. 4, a material layer 62 is formed over substrate 22 and over or atop fill material upper surface 60. Preferably, a portion of the layer is formed to contact the storage node layer. For purposes of the ongoing discussion, layer 62 constitutes a second material. Preferably, and for reasons which will become apparent below, material 62 is selected to be a material which is different from, and one which can be etched slower relative to material from which layer 42 is formed. Additionally, layer 62 preferably comprises a material which can be deposited at a temperature which is lower than the flow temperature of filling material 52. In one embodiment, layer 62 comprises an insulative material which is formed over the substrate and within less than an entirety of interior volume 50. Preferably, layer 62 is formed over filler material 52 as well. In another embodiment, layer 62 is formed within less than the entire capacitor container and covers less than the entire capacitor storage node layer outer surface. Where, as here, layer 42 has been described to comprise BPSG, a suitable material for material 62 is oxygen-doped, PECVD amorphous silicon. Such exemplary material can be deposited by combining silane gas with $N_2O$, $O_2$, or $CO_2$. Another preferred material is a so-called DARC material, i.e. a dielectric/deposited anti-reflective coating, to produce a $SiO_xN_y$ material. Of course, other dielectric materials, and other materials can be used.

Figure 5:
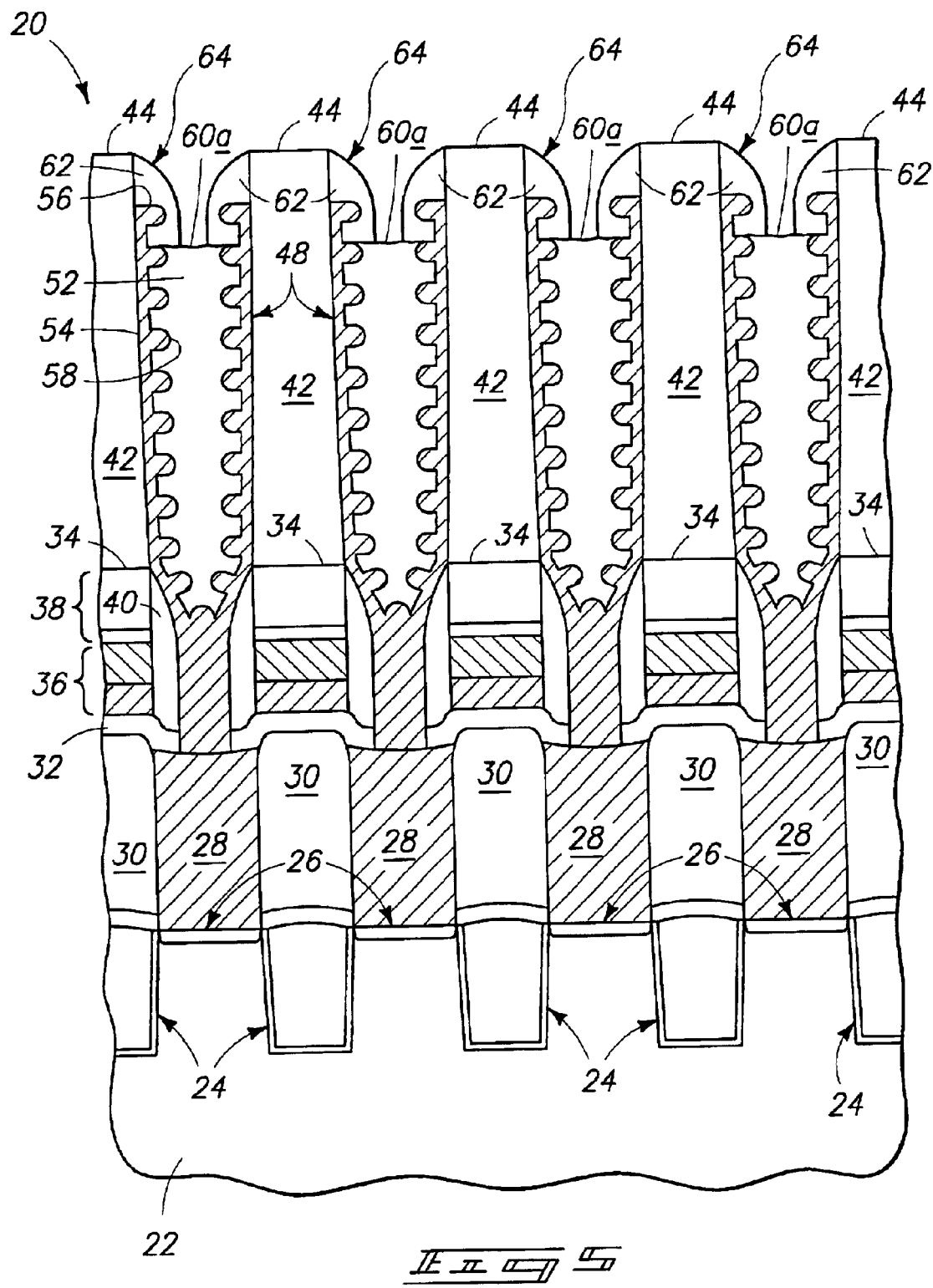
FIG. 5 is a view of the FIG. 1 wafer fragment at a processing step which is different from that which is shown in FIG. 4.

Referring to FIG. 5, portions 60a of the upper surface of filling material 52 are exposed by removing portions of layer 62. In this manner, the opening is redefined as a narrower opening which, in this example, exposes exposed portions 60a of filler material 52. In one embodiment, removal of the material layer portions is sufficient to cap at least a portion of rim 56. In another embodiment, encasement structures 64 are formed from layer 62 over an uppermost portion of the storage node layer outer surface. Such defines, in one embodiment, a protective cap over uppermost surface 56. In a preferred embodiment, the encasement structure or protective cap 64 is also formed over a portion of one of the side surfaces of the capacitor storage node. In the illustrated and preferred embodiment, a portion of inside surface 58 is covered with material of the encasement structure or protective cap. In another embodiment, encasement structure or protective cap 64 comprises a dielectric cap which is formed within the opening of each capacitor container and covers less than an entire portion of inside surface 58. Preferably, formation of the encasement structure or protective cap takes place through anisotropic etching of layer 62. The etching is, in one embodiment, sufficient to leave a portion of the material occluding the opening and preferably extending into the interior volume. An exemplary etch chemistry consists of fluorocarbon and hydrofluorocarbon gas mixtures.

Figure 6:
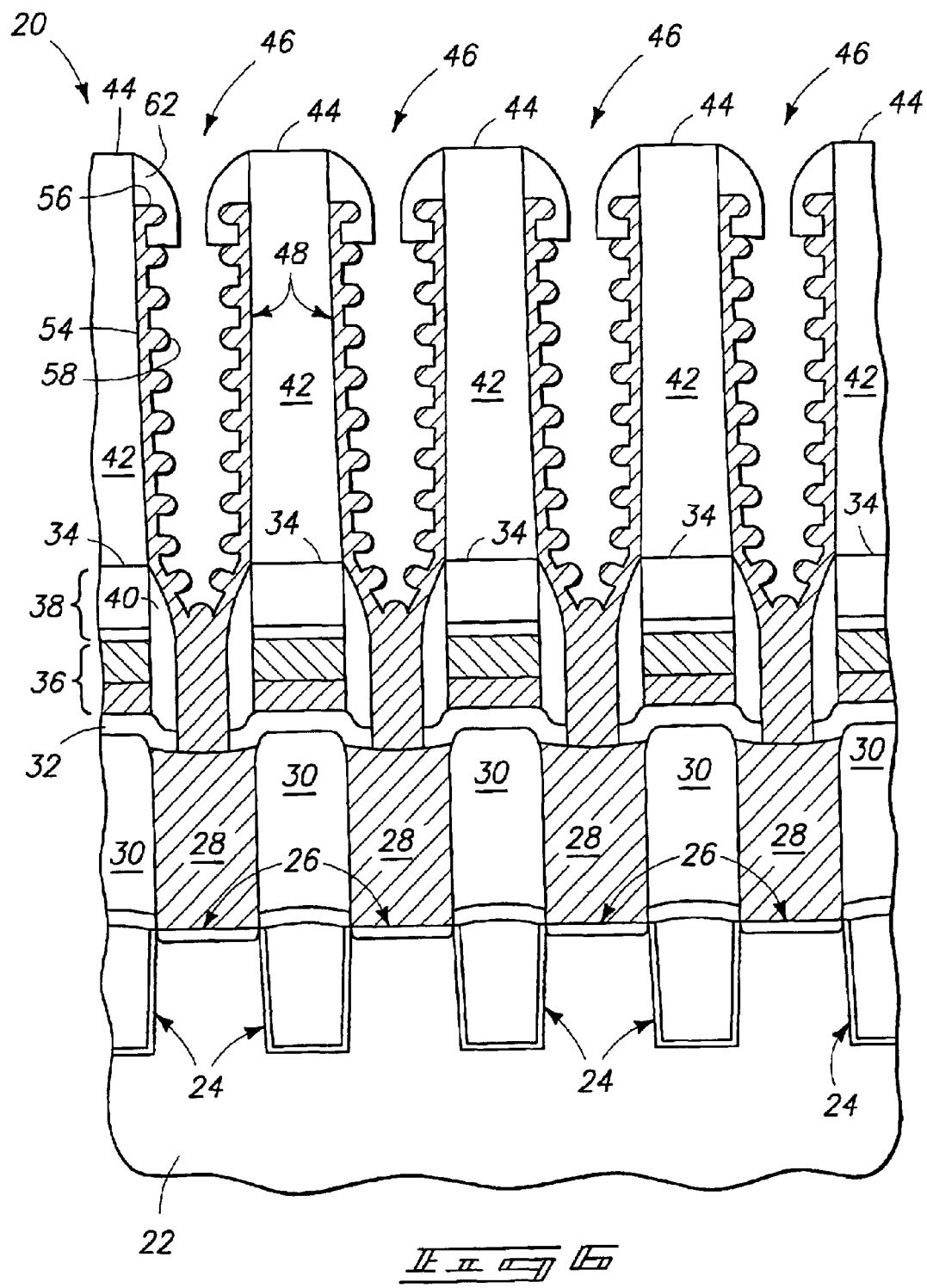
FIG. 6 is a view of the FIG. 1 wafer fragment at a processing step which is different from that which is shown in FIG. 5.

Referring to FIG. 6, and in accordance with one embodiment, filler material 52 (FIG. 5) is removed from within capacitor containers 46. In the illustrated example, such constitutes removing filling material from elevationally below material layer 62. Such can take place through the use of conventional techniques such as $O_2$ plasma.

Figure 7:
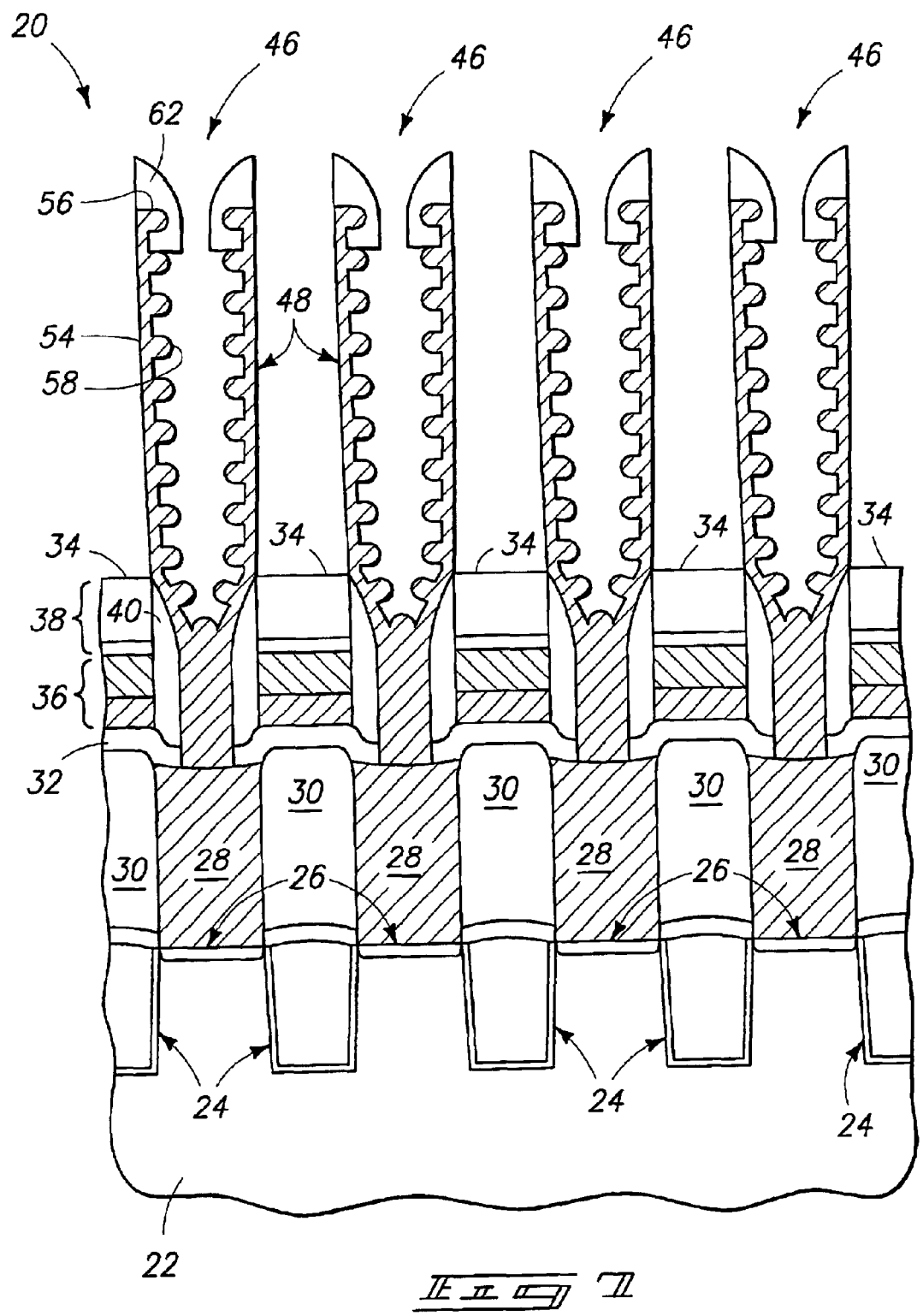
FIG. 7 is a view of the FIG. 1 wafer fragment at a processing step which is different from that which is shown in FIG. 6.

Referring to FIG. 7, and after capping rim portion 56, at least some of the container-defining material or insulative material 42 (FIG. 6) is removed. In a preferred embodiment, the removal of the container-defining material takes place by selectively removing the material relative to capping material 62. Accordingly, such constitutes, in the preferred embodiment, selectively removing insulative material relative to material from which the protective cap is formed. Alternately considered, such constitutes removing material of the first material selectively relative to material of the second material. In one embodiment, the removal of material 42 can take place through a timed etch. Where layer 42 comprises BPSG, and material 62 comprises $SiO_xN_y$, an exemplary etch can include a combination of acetic acid and hydrofluoric acid. A more specific chemistry is as follows: Acetic acid:$HF$:$H_2O$ in ratio 10:1:1 used at a temperature of 50° C.

Figure 8:
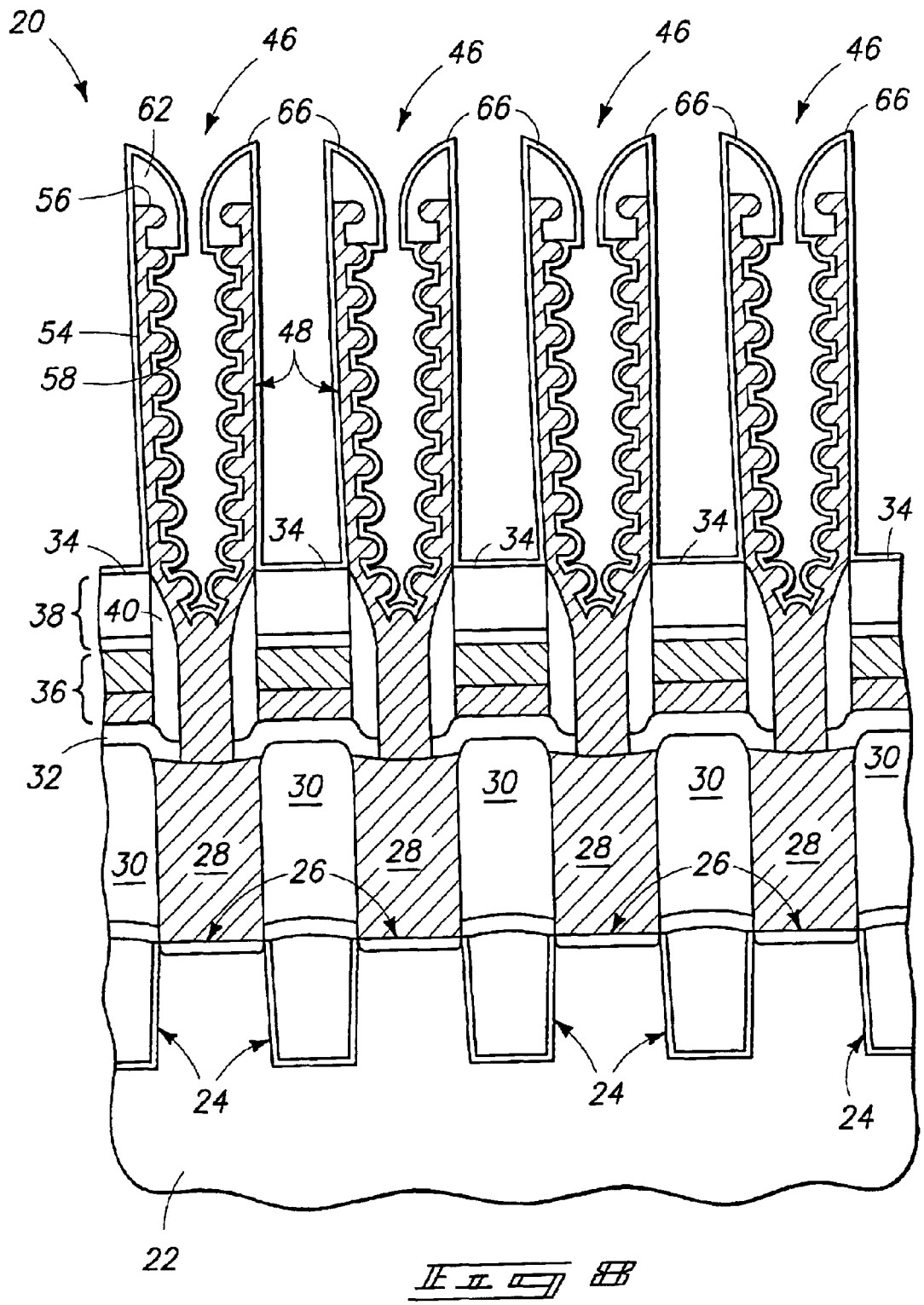
FIG. 8 is a view of the FIG. 1 wafer fragment at a processing step which is different from that which is shown in FIG. 7.

Referring to FIG. 8, a capacitor dielectric region 66 is formed over capacitor storage node layer 48. In one embodiment, such constitutes forming a capacitor dielectric functioning region which is discrete from material layer 62 comprising the protective cap over each storage node layer. The capacitor dielectric functioning region is disposed operably proximate at least a portion of the capacitor storage node layer outer surface (i.e., outside surface 54, uppermost surface 56, and inside surface 58). Accordingly, and in a preferred embodiment, the capacitor dielectric layer or dielectric functioning region is formed over at least some of one of the side surfaces, and preferably at least some of both of the side surfaces.

Figure 9:
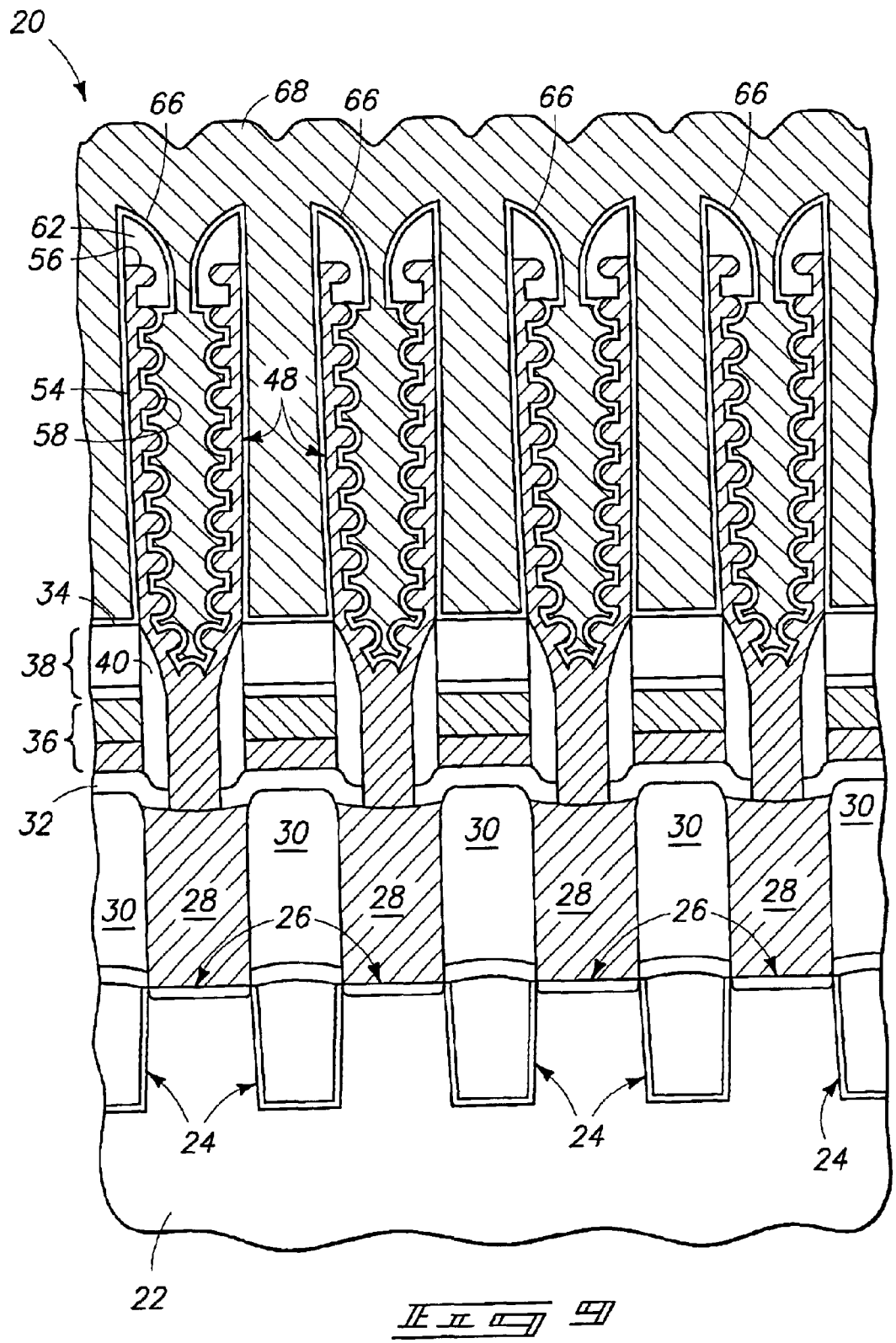
FIG. 9 is a view of the FIG. 1 wafer fragment at a processing step which is different from that which is shown in FIG. 8.

Referring to FIG. 9, a cell electrode layer or cell plate layer 68 is formed over the substrate and preferably portions of capacitor storage node layer 48. Accordingly, cell electrode layer 68 is formed over the dielectric functioning region 66 and the protective cap formed from material layer 62.

Figure 10:
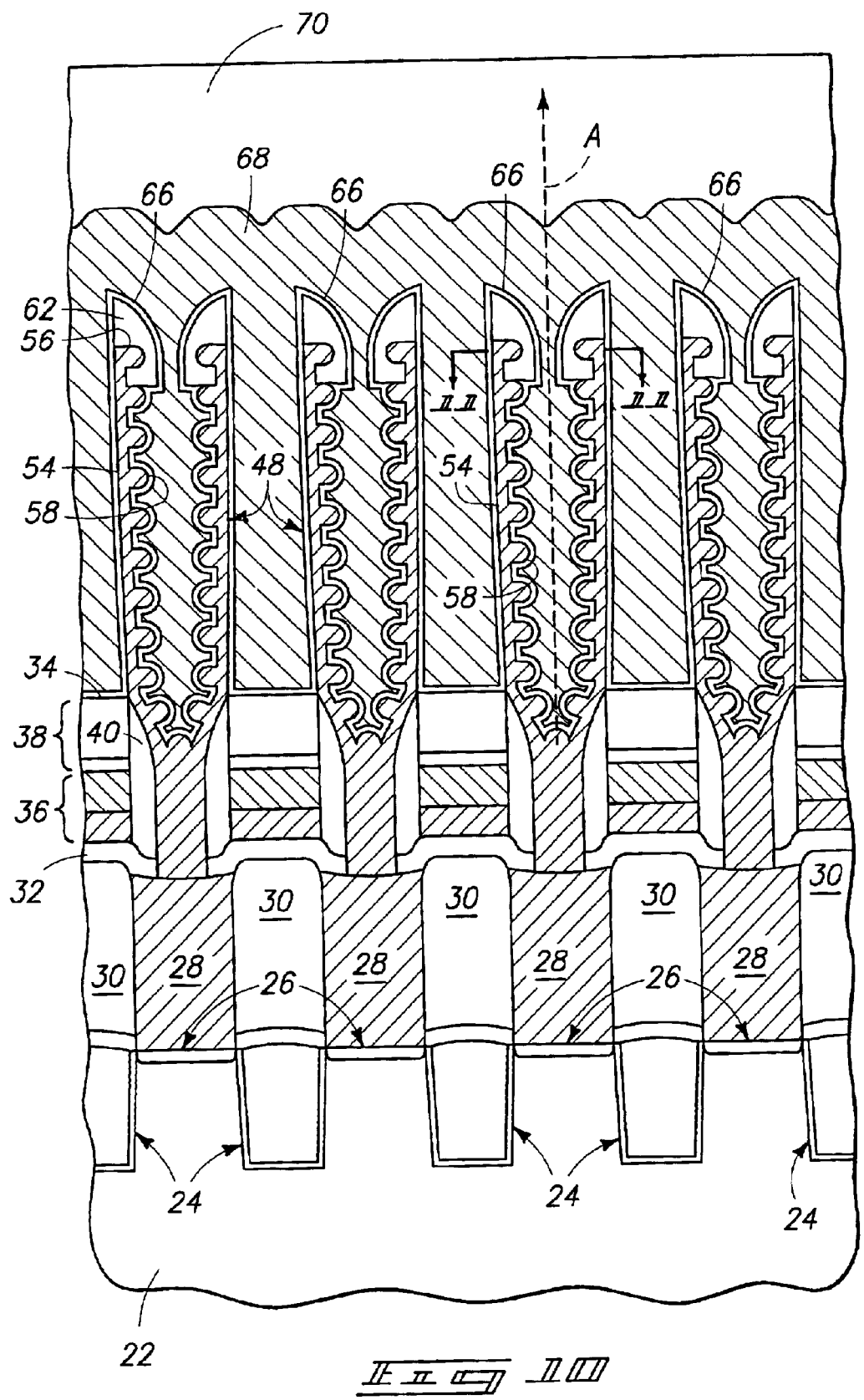
FIG. 10 is a view of the FIG. 1 wafer fragment at a processing step which is different from that which is shown in FIG. 9.

Referring to FIG. 10, an insulative material layer 70, e.g. BPSG, is formed over substrate 22 with subsequent processing taking place through known techniques.

Figure 11:
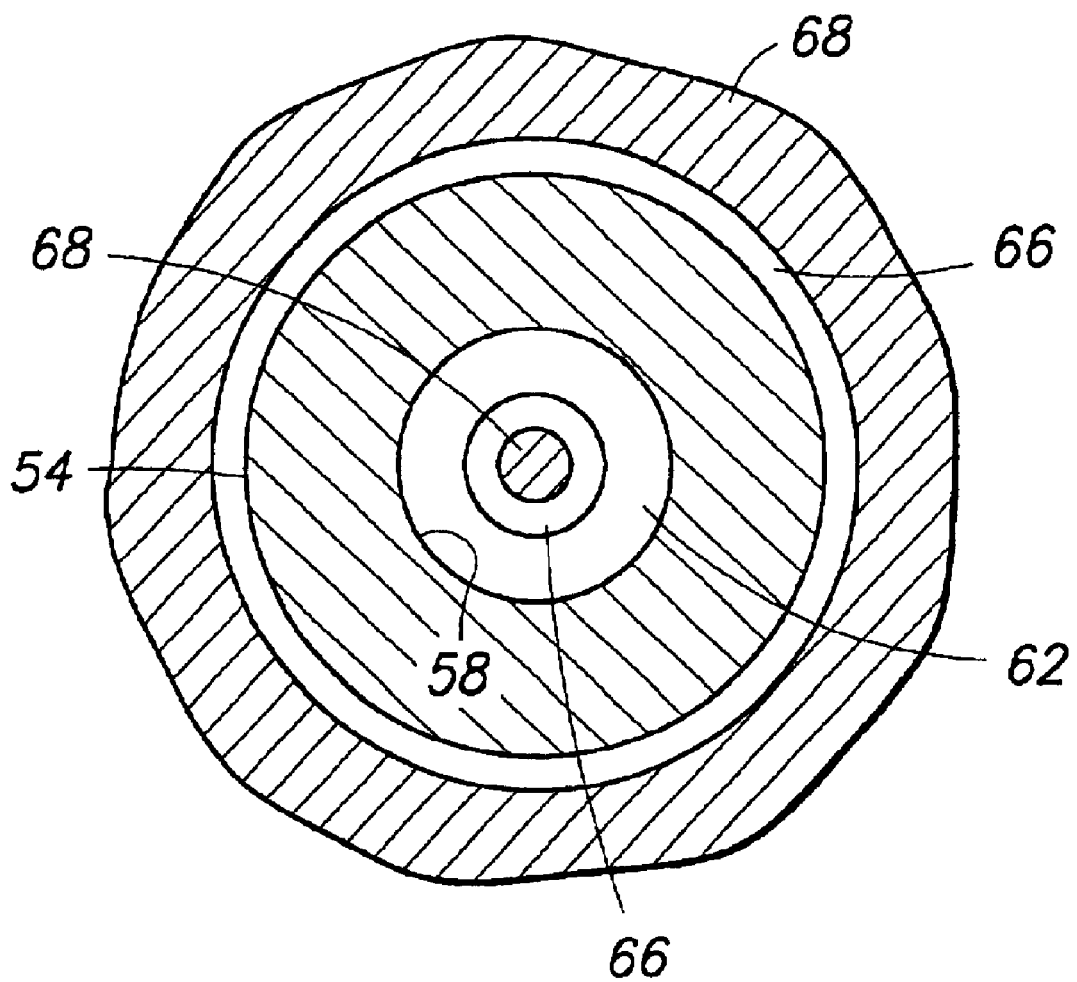
FIG. 11 is a somewhat enlarged view which is taken along 11—11 in FIG. 10.

Referring to FIGS. 10 and 11, and in accordance with one embodiment of the invention, the removal of material layer 62 forms a band (also designated 62) inside of the capacitor container and over uppermost surface 56 of capacitor storage node layer 48. Accordingly, a capacitor is provided having a capacitor storage node 48 with an outside surface 54 and an inside surface 58 spaced inwardly from the outside surface. The surfaces define, as shown in FIG. 10, an elongate tubular body having a terminus which defines an opening into interior region or volume 50 of the tubular body. An insulative band 62 is disposed adjacent the opening and is joined with the terminus of the tubular body. A capacitor dielectric functioning region 66 is disposed over portions of the inside and outside surfaces, and a cell plate layer 68 is disposed over the capacitor dielectric functioning region 66. In one embodiment, the elongate tubular body extends along a central axis A (FIG. 10) and band 62 generally tapers along the central axis. In another embodiment, one portion of the band is disposed within interior region 50, and another portion of the band is disposed outside of interior region 50. Alternately considered, a material, e.g. material 62, is disposed over the tubular body and occludes a portion of the opening. In one embodiment, the material which occludes the opening also extends into a portion of the interior region. Preferably, the material has an elevational thickness over the tubular body which is greater than the thickness of the dielectric functioning region. For example, a portion of material 62 is seen to be disposed elevationally over uppermost surface 56. That portion is elevationally thicker than the relatively thin dielectric functioning region 66.

Advantages of the inventive methods and structures include that problems associated with container-to-container shorts from particles residing on the top of the cells connecting two adjacent cells are mitigated. Such advantages are particularly useful in the context of containers using roughened polysilicon such as HSG polysilicon for the capacitor storage node layers. The inventive methods and structures are even more useful in the context of dual-sided containers having dielectric functioning regions and cell plate layers formed over both inside and outside surfaces.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of at least partially forming a capacitor comprising:
   forming a capacitor storage node layer over a substrate, the capacitor storage node layer having an uppermost rim defining an opening into an interior volume; and
   prior to forming a capacitor dielectric layer, forming a cap by capping at least a portion of the rim within the interior volume by forming a material which is different from the capacitor storage node layer over the rim portion.

2. The method of claim 1, wherein the capping of the rim portion comprises forming an insulative material thereover.

3. The method of claim 1, wherein the capping of the rim portion comprises forming an insulative material within less than an entirety of the interior volume.

4. The method of claim 1, wherein the capping of the rim portion comprises forming an insulative material layer over the substrate and anisotropically etching the insulative material layer.

5. The method of claim 1 further comprising prior to the capping of the rim portion, filling less than the interior volume with a filler material which is present during the capping.

6. The method of claim 1 further comprising prior to the capping of the rim portion, filling less than the interior volume with a filler material which is present during the capping, and wherein the capping of the rim portion comprises forming an insulative material layer over the substrate and the filler material and anisotropically etching the layer.

7. The method of claim 1, wherein the forming of the capacitor storage node layer comprises:
   forming a container into a container-defining material over the substrate;
   forming a capacitor storage node layer within the container; and
   recessing the capacitor storage node layer to below an uppermost surface of the container-defining material.

8. The method of claim 7, wherein the capacitor storage node layer comprises roughened polysilicon.

9. The method of claim 1, wherein the forming of the capacitor storage node layer comprises:
   forming a container into a container-defining material over the substrate;
   forming a capacitor storage node layer within the container;
   recessing the capacitor storage node layer to below an uppermost surface of the container-defining material; and
   after the capping of the rim portion, removing at least some of the container-defining material.

10. The method of claim 9, wherein the removing of the container-defining material comprises removing said container-defining material selectively relative to the capping material which is formed over the rim portion.

11. The method of claim 1, wherein the forming of the capacitor storage node layer comprises:
    forming a container into a container-defining material over the substrate;
    forming a capacitor storage node layer within the container;
    recessing the capacitor storage node layer to below an uppermost surface of the container-defining material; and
    wherein the capping of the rim portion comprises forming an insulative material layer over the substrate and anisotropically etching the insulative material layer.

12. The method of claim 1, wherein the forming of the capacitor storage node layer comprises:
    forming a container into a container-defining material over the substrate;
    forming a capacitor storage node layer within the container;
    recessing the capacitor storage node layer to below an uppermost surface of the container-defining material; and
    further comprising prior to the capping of the rim portion, filling less than the interior volume with a filler material.

13. The method of claim 1, wherein the forming of the capacitor storage node layer comprises:
    forming a container into a container-defining material over the substrate;
    forming a capacitor storage node layer within the container;
    recessing the capacitor storage node layer to below an uppermost surface of the container-defining material; and
    further comprising prior to the capping of the rim portion, filling less than the interior volume with a filler material, and
    wherein the capping of the rim portion comprises forming an insulative material layer over the substrate and the filler material and anisotropically etching the insulative material layer.

14. The method of claim 1, further comprising, after capping the rim, forming the capacitor dielectric layer and a cell electrode layer over the capacitor storage node layer within the interior volume.

15. A method of at least partially forming a capacitor comprising:
    forming a capacitor storage node layer over a substrate, the capacitor storage node layer having an uppermost rim defining an opening into an interior volume; and
    forming a layer of material over the uppermost rim within only an upper portion of the interior volume.

16. The method of claim 15, further comprising anisotropically etching said layer of material sufficient to leave a portion of the material occluding the opening.

17. The method of claim 15, further comprising anisotropically etching said layer of material sufficient to leave a portion of the material extending into the interior volume.

18. The method of claim 15, further comprising anisotropically etching said layer of material sufficient to leave a portion of the material extending into the interior volume and occluding the opening.

19. The method of claim 15, wherein the forming of the layer of material comprises forming a portion of said layer to contact the storage node layer.

20. The method of claim 15, further comprising anisotropically etching the layer of material.

21. A method of forming a capacitor comprising:
    forming a capacitor storage node layer comprising roughened polysilicon over a substrate, the capacitor storage node layer having an uppermost rim defining an opening into an interior volume;
    forming an insulative cap by capping at least a portion of the rim within the interior volume by forming a material which is different from the capacitor storage node layer over the rim portion; and
    after the capping of the rim, forming a capacitor dielectric region and a cell electrode layer over the capacitor storage node layer.

22. The method of claim 21, wherein capping comprises forming an insulative material within less than an entirety of the interior volume.

23. The method of claim 21, wherein capping comprises forming an insulative material layer over the substrate and anisotropically etching the insulative material layer.

24. The method of claim 21, further comprising, prior to capping, filling less than the interior volume with a filler material which is present during capping.

25. The method of claim 21, further comprising, prior to capping, filling less than the interior volume with a filler material which is present during capping, and wherein capping comprises forming an insulative material layer over the substrate and the filler material and anisotropically etching the insulative material layer.

26. The method of claim 21, wherein forming the capacitor storage node layer comprises:
    forming a container into a container-defining material over the substrate;
    forming the capacitor storage node layer within the container; and recessing the capacitor storage node layer to below an uppermost surface of the container-defining material.

27. The method of claims 21, wherein forming the capacitor storage node layer comprises:
    forming a container into a container-defining material over the substrate;
    forming the capacitor storage node layer within the container;
    recessing the capacitor storage node layer to below an uppermost surface of the container-defining material; and
    after capping, removing at least some of the container-defining material.

28. The method of claim 27, wherein removing the container-defining material comprises removing said container-defining material selectively relative to the capping material which is formed over the rim portion.

29. A method of at least partially forming a capacitor comprising:
    forming a capacitor storage node layer over a substrate, the capacitor storage node layer having an uppermost rim defining an opening into an interior volume;
    forming a cap by capping at least a portion of the rim within the interior volume by forming a material which is different from the capacitor storage node layer over the rim portion; and
    prior to the capping of the rim portion, filling less than the interior volume with a filler material which is present during the capping.

30. The method of claim 29, wherein the capping of the rim portion comprises forming an insulative material layer over the substrate and the filler material and anisotropically etching the layer.

31. A method of at least partially forming a capacitor comprising:
    forming a capacitor storage node layer over a substrate, the capacitor storage node layer having an uppermost rim defining an opening into an interior volume; and
    forming a cap by capping at least a portion of the rim within the interior volume by forming a material which is different from the capacitor storage node layer over the rim portion, wherein the forming of the capacitor storage node layer comprises:
        forming a container into a container-defining material over the substrate;
        forming a capacitor storage node layer within the container;
        recessing the capacitor storage node layer to below an uppermost surface of the container-defining material; and
        after the capping of the rim portion, removing at least some of the container-defining material.

32. The method of claim 31, wherein the removing of the container-defining material comprises removing said container-defining material selectively relative to the capping material which is formed over the rim portion.

33. A method of at least partially forming a capacitor comprising:
    forming a capacitor storage node layer over a substrate, the capacitor storage node layer having an uppermost rim defining an opening into an interior volume; and
    forming a cap by capping at least a portion of the rim within the interior volume by forming a material which is different from the capacitor storage node layer over the rim portion, wherein the forming of the capacitor storage node layer comprises:
        forming a container into a container-defining material over the substrate;
        forming a capacitor storage node layer within the container;
        recessing the capacitor storage node layer to below an uppermost surface of the container-defining material; and
        further comprising prior to the capping of the rim portion, filling less than the interior volume with a filler material.

34. A method of at least partially forming a capacitor comprising:
    forming a capacitor storage node layer over a substrate, the capacitor storage node layer having an uppermost rim defining an opening into an interior volume; and
    forming a cap by capping at least a portion of the rim within the interior volume by forming a material which is different from the capacitor storage node layer over the rim portion, wherein the forming of the capacitor storage node layer comprises:
        forming a container into a container-defining material over the substrate;
        forming a capacitor storage node layer within the container;
        recessing the capacitor storage node layer to below an uppermost surface of the container-defining material; and
        further comprising prior to the capping of the rim portion, filling less than the interior volume with a filler material, and
        wherein the capping of the rim portion comprises forming an insulative material layer over the substrate and the filler material and anisotropically etching the insulative material layer.

35. A method of forming a capacitor comprising:
    forming a capacitor storage node layer over a substrate, the capacitor storage node layer having an uppermost rim defining an opening into an interior volume;
    forming a cap by capping at least a portion of the rim within the interior volume by forming a material which is different from the capacitor storage node layer over the rim portion; and
    after capping the rim, forming a capacitor dielectric region and a cell electrode layer over the capacitor storage node layer within the interior volume.

* * * * *

UNITED STATES PATENT AND TRADEMARK OFFICE
CERTIFICATE OF CORRECTION

PATENT NO. : 6,844,230 B2
DATED : January 18, 2005
INVENTOR(S) : Reinberg

It is certified that error appears in the above-identified patent and that said Letters Patent is hereby corrected as shown below:

Column 2,
Line 13, please delete "is" after "conductor".

Column 4,
Line 24, please delete "so" after "filled".

Column 9,
Line 3, please delete "claims" after "of" and insert -- claim --.

Signed and Sealed this

Fourth Day of October , 2005

JON W. DUDAS
*Director of the United States Patent and Trademark Office*